United States Patent
Su (10) Patent No.: US 10,014,854 B2
(45) Date of Patent: Jul. 3, 2018

(54) RESET CIRCUIT AND ELECTRONIC DEVICE

(71) Applicant: Guangdong Oppo Mobile Telecommunications Corp., Ltd., Dongguan, Guangdong (CN)

(72) Inventor: Shangding Su, Guangdong (CN)

(73) Assignee: Guangdong Oppo Mobile Telecommunications Corp., Ltd., Dongguan, Guangdong (CN)

(*) Notice: Subject to any disclaimer, the term of this patent is extended or adjusted under 35 U.S.C. 154(b) by 0 days.

(21) Appl. No.: 15/470,411

(22) Filed: Mar. 27, 2017

(65) Prior Publication Data

US 2017/0201249 A1 Jul. 13, 2017

Related U.S. Application Data

(63) Continuation of application No. PCT/CN2016/084741, filed on Jun. 3, 2016.

(30) Foreign Application Priority Data

Jun. 3, 2015 (CN) .......................... 2015 1 0300799

(51) Int. Cl.
*H03L 7/00* (2006.01)
*H03K 17/22* (2006.01)
*H02J 7/00* (2006.01)

(52) U.S. Cl.
CPC .......... *H03K 17/223* (2013.01); *H02J 7/0052* (2013.01); *H02J 7/0068* (2013.01)

(58) Field of Classification Search
CPC ..... H03K 17/223; H02J 7/0052; H02J 7/0068

USPC ................................................. 327/142, 143
See application file for complete search history.

(56) References Cited

U.S. PATENT DOCUMENTS

| | | | | |
|---|---|---|---|---|
| 6,492,848 B1* | 12/2002 | Lee | ...... | H03K 17/223 |
| | | | | 327/143 |
| 8,324,945 B2* | 12/2012 | Ren | ...... | H03K 17/22 |
| | | | | 327/143 |
| 2004/0056694 A1* | 3/2004 | Tsai | ...... | H03K 17/223 |
| | | | | 327/142 |

(Continued)

FOREIGN PATENT DOCUMENTS

| | | | | |
|---|---|---|---|---|
| CN | 202495919 U | * 10/2012 | ...... | H03K 17/22 |
| CN | 104953992 A | 9/2015 | | |

(Continued)

*Primary Examiner* — Ryan Jager
(74) *Attorney, Agent, or Firm* — Young Basile Hanlon & MacFarlane, P.C.

(57) ABSTRACT

Provided is a reset circuit including a charging circuit, a driving circuit, and an execution circuit. The charging circuit is configured to, after a first voltage signal provided by a control port is received, generate a second voltage signal. The driving circuit is configured to amplify the second voltage signal, and output the amplified second voltage signal to an execution circuit, after it is detected that a value of the second voltage signal reaches a preset value. The execution circuit is configured to, after the amplified second voltage signal is received, generate a reset signal, and transfer the reset signal to a reset port. Further provided is an electronic device, which includes the foregoing reset circuit, a button, and a microcontroller.

18 Claims, 8 Drawing Sheets

(56) References Cited

U.S. PATENT DOCUMENTS

| | | | |
|---|---|---|---|
| 2004/0095173 A1* | 5/2004 | Lee | G06F 1/24 327/143 |
| 2006/0109037 A1* | 5/2006 | Hsu | H03K 17/223 327/143 |
| 2007/0001720 A1* | 1/2007 | Li | G06F 1/28 327/143 |
| 2009/0174443 A1* | 7/2009 | Li | H03K 5/1254 327/143 |
| 2010/0013529 A1* | 1/2010 | Kawakita | H03K 17/22 327/143 |
| 2011/0074470 A1* | 3/2011 | Sanborn | H03K 17/223 327/143 |
| 2012/0169385 A1* | 7/2012 | Ren | H03K 17/20 327/142 |
| 2014/0285244 A1* | 9/2014 | Zhou | G09G 5/006 327/143 |
| 2015/0200653 A1* | 7/2015 | Kim | H03K 17/223 327/143 |
| 2015/0236689 A1* | 8/2015 | Mandal | H03K 17/223 327/143 |

FOREIGN PATENT DOCUMENTS

| | | |
|---|---|---|
| CN | 204794936 U | 11/2015 |
| KR | 20040031861 A | 4/2004 |

* cited by examiner

RESET CIRCUIT AND ELECTRONIC DEVICE

CROSS-REFERENCE TO RELATED APPLICATION(S)

This application is a continuation of PCT/CN2016/084741, filed on Jun. 3, 2016, which claims priority to Chinese Patent Application No. 201510300799.0, filed on Jun. 3, 2015, the contents of both of which are herein incorporated by reference in their entireties.

TECHNICAL FIELD

The present disclosure relates to the field of electronic devices, and particularly to a reset circuit and an electronic device.

BACKGROUND

An electric device generally has a reset function, when the electronic device crashes due to improper operation or internal product problems, it is needed to start this reset function, that is, in the case of uninterruptible power supply, the electronic device can be restored to an initial state. In the related art, the reset in the electric device is usually implemented in a manner of a separate reset button or a toggle switch that is powered off. For example, for mobile phones and MP3, MP4, as well as other electric devices with a secondary battery, the reset is generally implemented via a reset hole, however, this approach requires the user to insert a small tool into the reset hole to tap to complete the reset, that is, the reset cannot be triggered without an appropriate external tool, and therefore is inconvenient. Some tablet PCs and other devices also try to add an additional reset button to achieve the reset function, however, the disadvantage of this approach is that the additional reset button will affect the appearance of the device design, and the separate reset button is easy to be false triggered in daily use and is inconvenient.

BRIEF DESCRIPTION OF THE DRAWINGS

In order to more clearly illustrate the technical solutions of the implementations of the present disclosure, the drawings used in the description of the implementations will be briefly described, it will be apparent that the drawings described in the following are implementations of the present disclosure, and it will be apparent to those skilled in the art that other drawings may be obtained from the drawings without any creative efforts.

DETAILED DESCRIPTION

In the following, the technical solutions of the implementations of the present disclosure will be described clearly and completely with reference to the accompanying drawings in the implementations of the present disclosure, obviously, the described implementations are a part rather than all of the implementations of the present disclosure. Based on the implementations described herein, all other implementations obtained by those of ordinary skill in the art without creative efforts shall fall within the protective scope of the present disclosure.

Figure 1:
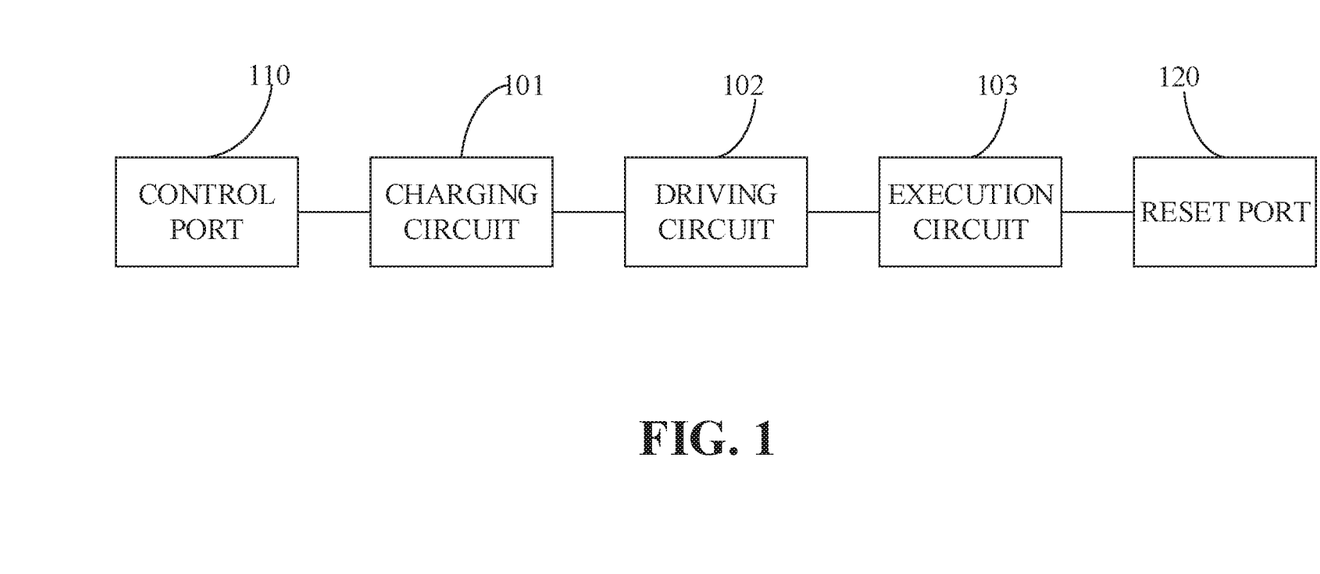
FIG. 1 is a schematic circuit structure diagram of a reset circuit of a first implementation of the present disclosure.

FIG. 1 is a schematic circuit structure diagram of a reset circuit of an implementation of the present disclosure.

Refer to FIG. 1, the reset circuit of the implementation of the present disclosure includes: a charging circuit 101, a driving circuit 102, an execution circuit 103, a control port 110, and a reset port 120.

The charging circuit 101 has an input end connected with the control port 110, an output end connected with the driving circuit 102, and is configured to generate a second voltage signal after a first voltage signal provided by the control port 110 is received.

The driving circuit 102 has an input end connected with the output end of the charging circuit 101, an output end connected with the execution circuit 103, and is configured to amplify the second voltage signal after it is detected that the value of the second voltage signal (that is, the voltage value corresponding to the second voltage signal) reaches a preset value and output the amplified second voltage signal to the execution circuit 103.

The execution circuit 103 has an input end connected with the output end of the driving circuit 102, an output end connected with the reset port 120, and is configured to generate a reset signal after the amplified second voltage signal is received and transfer the reset signal to the reset port 120; a reset operation can be performed on a microcontroller of an electric device through the reset port 120.

In the implementation of the present disclosure, the first voltage signal is a high level signal and the second voltage signal is a level signal after a capacitor C1 is charged. As an implementation, the control port 110 provided in the present disclosure can be integrated with the electric device, and the control port 110 can be set in associate with a button of the electric device; in this way, when a button operation is performed on the electric device, the control port 110 can be triggered to provide the first voltage signal, and the charging circuit 101 can generate the second voltage signal after the first voltage signal is received; the driving circuit 102 amplifies the second voltage signal and transfer the amplified second voltage signal to the execution circuit 103 when the value of the second voltage signal reaches a preset value; the execution circuit 103 generates a reset signal after the amplified second voltage signal is received and transfer the reset signal to the reset port 120. The button operation can be to press and hold a button for a preset time or press and hold a combination of a plurality of buttons simultaneously. Alternatively, the button operation can be replaced with a knob operation, and the present disclosure is not limited thereto.

Figure 2:
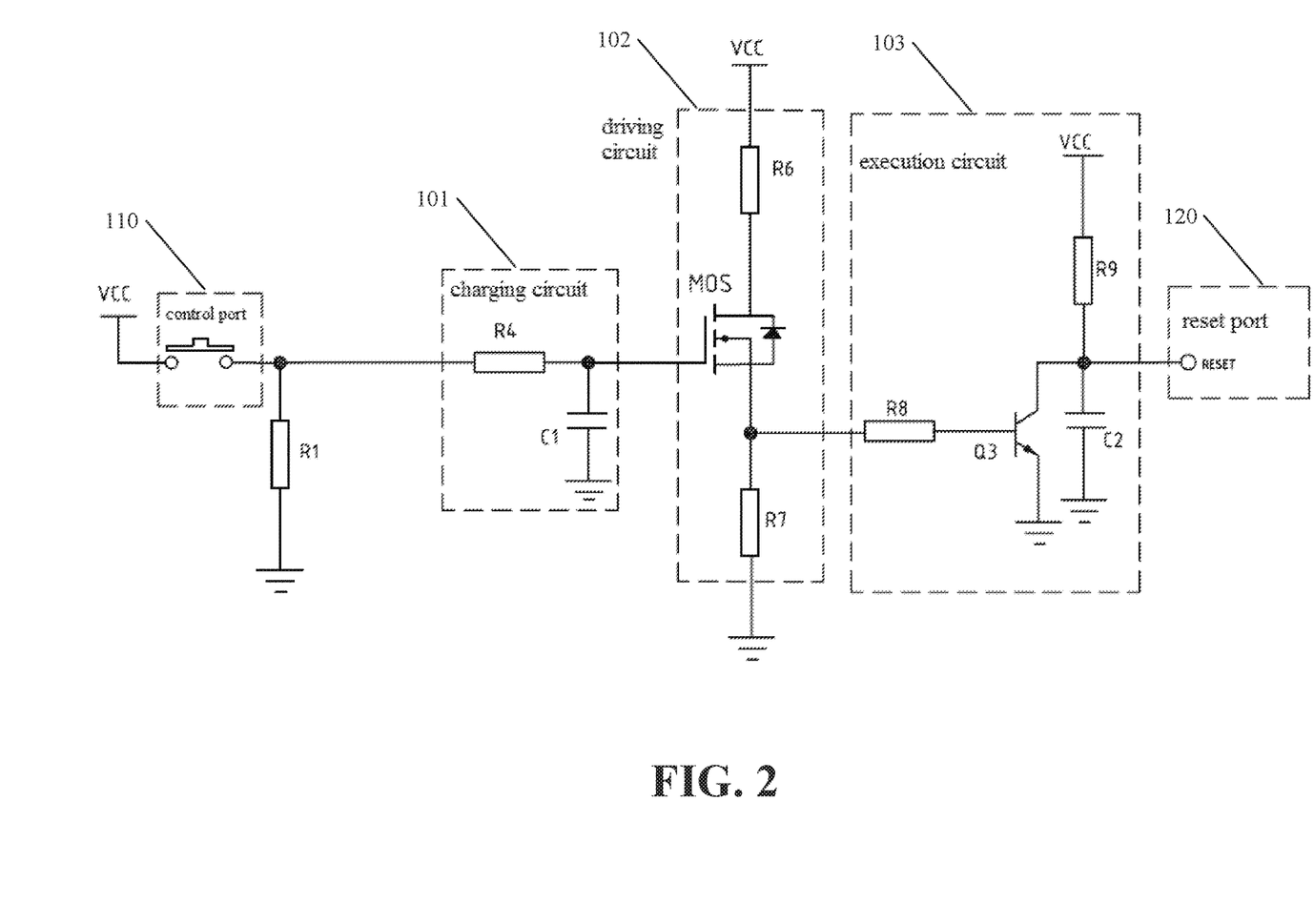
FIG. 2 is a schematic circuit principle diagram of a reset circuit of a second implementation of the present disclosure.

FIG. 2 is a schematic structure diagram of a preset circuit of a second implementation of the present disclosure.

Refer to FIG. 2, the reset circuit of the implementation includes a charging circuit 101, a driving circuit 102, an execution circuit 103, a control port 110, and a reset port 120.

Charging Circuit 101

The charging circuit 101 has an input end connected with the control port 110, an output end connected with the driving circuit 102, and is configured to generate a second voltage signal after a first voltage signal provided by the control port 110 is received.

Specifically, the charging circuit 101 includes a resistor R4 and a capacitor C1; the resistor R4 and the capacitor C1 are connected in series to form a series branch, wherein the series branch has one end as an input end of the charging circuit 101 and the other end as an output end of the charging circuit 101. As illustrated in FIG. 2, the resistor R4 and the capacitor C1 are connected in series; the resistor R4 has one end as the input end of the charging circuit and the other end connected with one end of the capacitor C1, and the capacitor C1 has the other end grounded; a node between the other end of the resistor R4 and the one end of the capacitor C1 acts as the output end of the charging circuit.

Furthermore, the charging circuit 101 further includes a resistor R1, and the control port 110 is grounded via the resistor R1. As illustrated in FIG. 2, the resistor R1 has one end connected with one end of the resistor R4 and the other end grounded.

In the implementation of the present disclosure, the first voltage signal is a high level signal and the second voltage signal is a level signal after the capacitor C1 is charged. Specifically, the control port 110 provided in the implementation of the present disclosure can be integrated with an electric device, when a button operation is performed on the electric device, the control port 110 is triggered to provide a high level signal, and the capacitor C1 can be charged via the resistor R4 such that the level value of the capacitor C1 can rise gradually. The button operation can be to press and hold a button for a preset time or press and hold a combination of a plurality of buttons simultaneously. Alternatively, the button operation can be replaced with a knob operation, and the present disclosure is not limited thereto.

Driving Circuit 102

The driving circuit 102 has an input end connected with the output end of the charging circuit 101, an output end connected with the execution circuit 103, and is configured to amplify the second voltage signal after it is detected that the value of the second voltage signal (that is, the level value of the capacitor C1) reaches a preset value and output the amplified second voltage signal to the execution circuit 103.

The driving circuit 102 includes a MOS transistor and a first power supply end; the MOS transistor has a gate which is the input end of the driving circuit 102, and the MOS transistor has a source which is the output end of the driving circuit 102; the gate of the MOS transistor is connected with the output end of the charging circuit 101 and the output end of the reverse discharge circuit, the source of the MOS transistor is connected with the input end of the execution circuit 103, and the MOS transistor has a drain connected with the first power supply end.

Furthermore, the driving circuit 102 further includes a resistor R6 and a resistor R7; the drain of the MOS transistor is connected to the first power supply end via the resistor R6, and the source of the MOS transistor is grounded via the resistor R7.

That is to say, as illustrated in FIG. 2, the driving circuit includes the MOS transistor, the resistor R7, the first power supply end, and the resistor R6; the gate of the MOS transistor is the input end of the driving circuit, the source of the MOS transistor is the output end of the driving circuit and is grounded via the resistor R7, the drain of the MOS transistor is connected with the first power supply end. The resistor R6 is connected between the first power supply end and the drain of the MOS transistor.

In the implementation of the present disclosure, when the level value of the capacitor C1 rises to a preset value, the MOS transistor of the driving circuit 102 is turned on; at this point, the MOS transistor can amplify the level signal of the capacitor C1 which has reached the preset value and output the amplified signal to the execution circuit 103. Generally, since the value of the resistor R1 is large and the drive capacity of the charging circuit 101 is weak, the driving circuit 102 can amplify the level signal of the capacity C1 which has reached the preset value and transfer the amplified signal to the execution circuit 103. In the implementation of the present disclosure, the MOS transistor is used for threshold detection and level signal amplification.

Execution Circuit 103

The execution circuit 103 has an input end connected with the output end of the driving circuit 102, an output end connected with the reset port 120, and is configured to generate a reset signal after the amplified second voltage signal is received and transfer the reset signal to the reset port 120.

Specifically, the execution circuit 103 includes a transistor Q3, a capacitor C2, and a second power supply end; the transistor Q3 has a base which is the input end of the execution circuit 103, the transistor Q3 has a collector which is the output end of the execution circuit 103; the base of the transistor Q3 is connected with the output end of the driving circuit 102, the collector of the transistor Q3 is grounded via the capacitor C2, and the transistor Q3 has an emitter grounded; the second power supply end is grounded via the capacitor C2.

The execution circuit 103 further includes a resistor R8 and a resistor R9; the base of the transistor Q3 is connected with the output end of the driving circuit 102 via the resistor R8, the collector of the transistor Q3 is connected with the reset port 120, and the emitter of the transistor Q3 is grounded; the second power supply is grounded via the resistor R9 and the capacitor C2. This circuit has an advantage that the cost is relatively low.

That is to say, as illustrated in FIG. 2, the execution circuit includes the transistor Q3, the capacitor C2, the second power supply end, the resistor R8, and the resistor R9, the base of the transistor Q3 is the input end of the execution circuit, the collector of the transistor Q3 is the output end of the execution circuit, the emitter of the transistor Q3 is grounded, and the collector of the transistor Q3 is grounded via the capacitor C2; the second power supply end is grounded via the capacitor C2. The base of the transistor Q3 is connected to the output end of the driving circuit via the resistor R8, the collector of the transistor Q3 is connected to the second power supply end via the resistor R9, and the second power supply end is grounded via the resistor R9 and the capacitor C2.

In the implementation, before the control port provides the first voltage signal, the second power supply end charges the capacitor C2 via the resistor R9; after the control port provides the first voltage signal, a source voltage of the MOS transistor continues to rise until the transistor Q3 is turned on, at this point, the capacitor C2 is discharged, and a low level reset signal will be generated after the capacitor C2 is discharged; the low level reset signal is transferred to the reset port 120 for the reset operation.

Reverse Discharge Circuit 104

Figure 3:
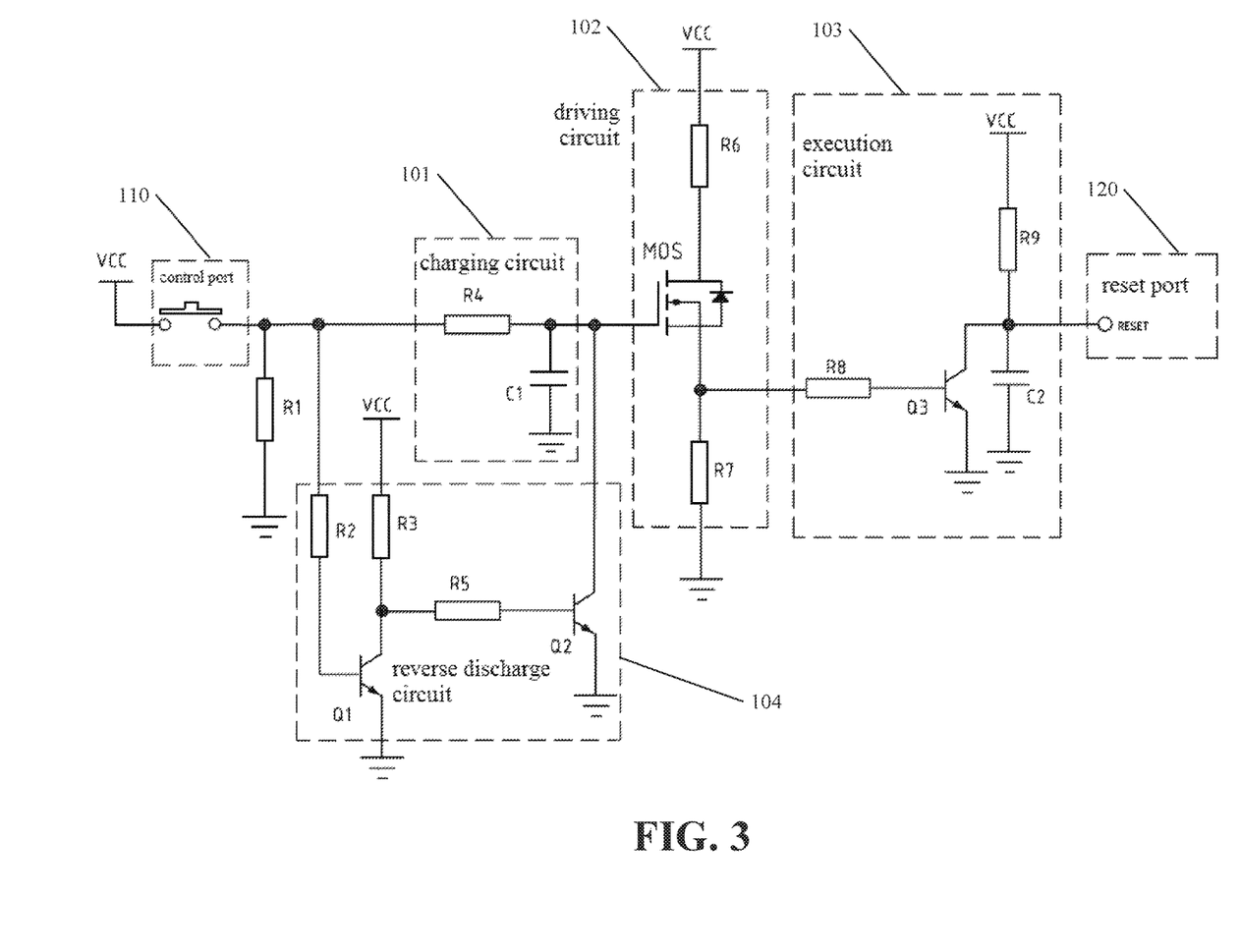
FIG. 3 is a schematic circuit principle diagram of another reset circuit of the second implementation of the present disclosure.

As an alternative implementation, as illustrated in FIG. 3, the reset circuit can further include a reverse discharge circuit 104; the reverse discharge circuit 104 has an input end connected with the control port 110, an output end connected with the output end of the charging circuit, and is configured to generate a fourth voltage signal after a third voltage signal provided by the control port 110 is received, so as to discharge the charging circuit, that is, discharge the capacitor C1.

As an implementation, the reverse discharge circuit 104 includes a transistor Q1, a transistor Q2, and a third power supply end; the transistor Q1 has a base which is the input end of the reverse discharge circuit 104, and the transistor Q2 has a collector which is the output end of the reverse discharge circuit 104; the base of the transistor Q1 is connected with the control port 110, the transistor Q1 has a collector connected with a base of the transistor Q2, and the transistor Q1 has an emitter grounded; the base of the transistor Q2 is connected with the collector of the transistor Q1, the collector of the transistor Q2 is connected with the output end of the charging circuit 101 and the input end of the driving circuit 102, the emitter of the transistor Q2 is grounded; the third power supply end is connected with the collector of the transistor Q1.

Furthermore, the reverse discharge circuit 104 further includes a resistor R2, a resistor R3, a resistor R5; the base of the transistor Q1 is connected to the control port 110 via the resistor R2, the collector of the transistor Q1 is connected to the base of the transistor Q2 via the resistor R5; the third power supply end is connected to the collector of the transistor Q1 via the resistor R3.

That is to say, as illustrated in FIG. 3, the reverse discharge circuit includes the transistor Q1, the transistor Q2 and the third power supply end, the resistor R2, the resistor R3, and the resistor R5. The base of the transistor Q1 is the input end of the reverse discharge circuit, the collector of the transistor Q2 is the output end of the reverse discharge circuit; the collector of the transistor Q1 is connected with the base of the transistor Q2, and the emitter of the transistor Q1 is grounded; the collector of the transistor Q2 is connected with the input end of the driving circuit, and the emitter of the transistor Q2 is grounded; the third power supply end is connected with the collector of the transistor Q1. The base of the transistor Q1 is connected to the control port via the resistor R2, the collector of the transistor Q1 is connected to the base of the transistor Q2 via the resistor R5, and the third power supply end is connected to the collector of the transistor Q1 via the resistor R3.

In this implementation, the third voltage signal is a low level signal; when the control port provides a high level signal, the transistor Q1 of the reverse discharge circuit is turned on while the transistor Q2 is turned off, at this point, the reverse discharge circuit has no effect on the charging circuit; on the other hand, when the control port provides a low level signal and the capacitor C1 stops charging, at this point, the transistor Q1 is turned off while the transistor Q2 is turned on, and the reverse discharge circuit will generate a fourth voltage signal for the capacitor C1 and perform discharge operation on the capacitor C1; the value of the level signal of the capacitor C1 rapidly drops below the preset value, such that the MOS transistor and the transistor Q3 can be turned off rapidly while the capacitor C2 continues to be charged and gradually returns to high level, so as to end the reset state. By providing the reverse discharge circuit 104, the capacitor C1 can be discharged rapidly so as to end the reset state; after the reset operation is released, the microcontroller can enter a normal working state quickly, thereby eliminating reset effects.

Control Port

According to an implementation of the present disclosure, the control port can be set in associate with a button of an electric device. When the button is triggered, the control port provides the first voltage signal.

According to another aspect of the present disclosure, the control port can be set in associate with a knob of an electric device. When the knob is rotated to a preset location, the control port provides the first voltage signal.

The work principle of the reset circuit of the implementation of the present disclosure will be described in detail with reference to FIG. 2 and FIG. 3.

The first voltage signal is a high level signal, the second voltage signal is a level signal after the capacitor C1 is charged, and the third signal is a low level signal. When the control port provides a high level signal, in the charging circuit, the capacitor C1 can be charged via the resistor R4, however, at this point, the transistor Q1 is turned on while the transistor Q2 is turned off, and the driving circuit has no effect; when the level value of the capacitor C1 after charging reaches a preset value, the MOS transistor of the driving circuit is turned on (to be specific, the MOS transistor can be turned on if the voltage difference between the gate and the source thereof reaches 1.1 V or 1.2V); the source level of the MOS transistor continues to rise, and when the source level of the MOS transistor reaches a certain value (generally, greater than 0.5V), the transistor Q3 is turned on, at this point, the capacitor C2 will be discharged and generate a low level reset signal, and the reset port will perform the reset operation upon receiving the reset signal; when the control port provides a low level signal, the capacitor C1 stops charging, at this point, the transistor Q1 is turned off while the transistor Q2 is turned on, the capacitor C1 is discharged, the MOS transistor and the transistor Q3 are turned off rapidly, and the capacitor C2 continues to be charged and the reset signal will not be issued continuously.

In this implementation, the third voltage signal is a low level signal, the input end of the reverse discharge circuit 104 is connected with the control port 110, the output end of the reverse discharge circuit 104 is connected with the output end of the charging circuit 101; when the control port 110 provides a low level signal, at this point, the capacitor C1 stops charging and the reverse discharge circuit 104 discharges the capacitor C1, the value of the level signal of the capacitor C1 drops rapidly and the reset signal is released, and the capacitor C2 is charged and returns to a high level gradually to end the reset state.

Figure 4:
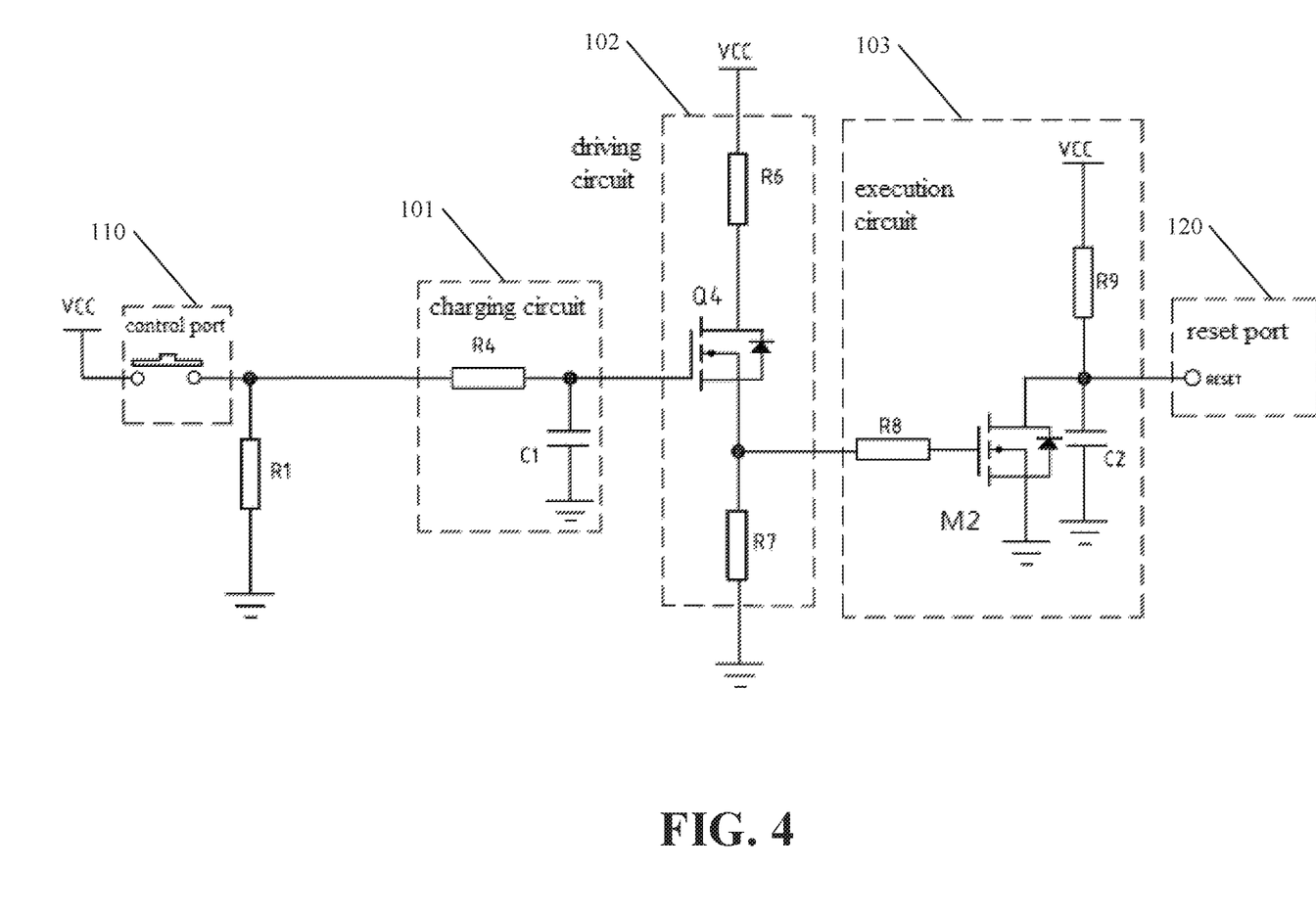
FIG. 4 is a schematic circuit principle diagram of a reset circuit of a third implementation of the present disclosure.

FIG. 4 is a schematic structure diagram of a reset circuit of the third implementation of the present disclosure.

Refer to FIG. 4, the reset circuit of the implementation includes a charging circuit 101, a driving circuit 102, an execution circuit 103, a control port 110, and a reset port 120.

Charging Circuit 101

The charging circuit 101 has an input end connected with the control port 110, an output end connected with the driving circuit 102, and is configured to generate a second voltage signal after a first voltage signal provided by the control port 110 is received.

Specifically, the charging circuit 101 includes a resistor R4 and a capacitor C1; the resistor R4 and the capacitor C1 are connected in series to form a series branch, among which the series branch has one end as the input end of the charging circuit 101 and the other end as the output end of the charging circuit 101. As illustrated in FIG. 4, the resistor R4 is connected in series with the capacitor C1, the resistor R4 has one end as the input end of the charging circuit and the other end connected with one end of the capacitor C1, and the capacitor C1 has the other end grounded; a node between the other end of the resistor R4 and one end of the capacitor C1 acts as the output end of the charging circuit.

Furthermore, the charging circuit 101 further includes a resistor R1, and the control port 110 is grounded via the resistor R1. As illustrated in FIG. 4, the resistor R1 has one end connected with one end of the resistor R3 and the other end grounded.

In the implementation of the present disclosure, the first voltage signal is a high level signal and the second voltage signal is a level signal after the capacitor C1 is charged. Specifically, the control port 110 provided in the implementation of the present disclosure can be integrated with an electric device, when a button operation is performed on the electric device, the control port 110 is triggered to provide a high level signal, and the capacitor C1 can be charged via the resistor R4 and the level value of the capacitor C1 can rise gradually. The button operation can be to press and hold a button for a preset time or press and hold a combination of a plurality of buttons simultaneously. Alternatively, the button operation can be replaced with a knob operation, and the present disclosure is not limited thereto.

Driving Circuit 102

The driving circuit 102 has an input end connected with the output end of the charging circuit 101, an output end connected with the execution circuit 103, and is configured to amplify the second voltage signal after it is detected that the value of the second voltage signal (that is, the level value of the capacitor C1) reaches a preset value and output the amplified second voltage signal to the execution circuit 103.

Specifically, the driving circuit 102 includes a MOS transistor Q4 and a first power supply end; the MOS transistor Q4 has a gate which is the input end of the driving circuit 102, and the MOS transistor Q4 has a source which is the output end of the driving circuit 102; the gate of the MOS transistor Q4 is connected with the output end of the charging circuit 101 and an output end of the reverse discharge circuit, and the source of the MOS transistor Q4 is connected with an input end of the execution circuit 103; the MOS transistor Q4 has a drain connected with the first power supply end. This reset circuit has low power consumption and can be advantageously applied to occasions requiring a high-frequency/high-speed circuit or high-current as well as occasions sensitive to the base or drain control current.

Furthermore, the driving circuit 102 further includes a resistor R6 and a resistor R7; the drain of the MOS transistor Q4 is connected with the first power supply end via the resistor R6, and the source of the MOS transistor Q4 is grounded via the resistor R7.

In the implementation of the present disclosure, when the value of the level signal of the capacitor C1 reaches a preset value, the MOS transistor Q4 of the driving circuit 102 is turned on, at this point, the MOS transistor Q4 can amplify the level signal of the capacitor C1 which has reached the preset vale and transfer the amplified signal to the execution circuit 103. Generally, since the value of the resistor R1 is relatively large and the drive capacity of the charging circuit 101 is weak, the driving circuit 102 can be provided so as to amplify the level signal of the capacitor C1 which has reached the preset value and transfer the amplified signal to the execution circuit 103. In the implementation of the present disclosure, the MOS transistor is used for threshold detection and level signal amplification.

Execution Circuit 103

The execution circuit 103 has an input end connected with the output end of the driving circuit 102, an output end connected with the reset port 120, and is configured to generate a reset signal after the amplified second voltage signal is received and transfer the reset signal to the reset port 120.

Specifically, the execution circuit 103 includes a field effect transistor M2, a capacitor C2, and a second power supply end; the field effect transistor M2 has a gate which is the input end of the execution circuit 103, the field effect transistor M2 has a drain which is the output end of the execution circuit 103; the gate of the field effect transistor M2 is connected with the output end of the driving circuit 102, the drain of the field effect transistor M2 is grounded via the capacitor C2, and the field effect transistor M2 has a source grounded; the second power supply end is grounded via the capacitor C2.

Furthermore, the execution circuit 103 further includes a resistor R8 and a resistor R9; the gate of the field effect transistor M2 is connected to the output end of the driving circuit 102 via the resistor R8, and the drain of the field effect transistor M2 is connected with the reset port 120, and the source of the field effect transistor M2 is grounded; the second power supply end is grounded via the resistor R9 and the capacitor C2.

That is to say, as illustrated in FIG. 4, the execution circuit includes the resistor R8, the resistor R9, the MOS transistor M2 and the capacitor C2, and the second power supply end; among them, the resistor R8 has one end connected with the output end of the driving circuit; the gate of the MOS transistor M2 is connected with the other end of the resistor R8, the source of the MOS transistor M2 is grounded, and the drain of the MOS transistor M2 is connected with the reset port; the resistor R9 has one end connected with the drain of the MOS transistor M2 and the other end connected with the second power supply end; the capacitor C2 has one end connected with the drain of the MOS transistor M2 and the other end grounded.

In this implementation, before the control port provides the first voltage signal, the second power supply end charges the capacitor C2 via the resistor R9; after the control port provides the first voltage signal, the source voltage of the MOS transistor Q4 continues to rise to turn on the field effect transistor M2, at this point, the capacitor C2 is discharged, and a low level reset signal is generated after the capacitor C2 is discharged; the reset signal is transferred to the reset port 120 for a reset operation.

Reverse Discharge Circuit 104

Figure 5:
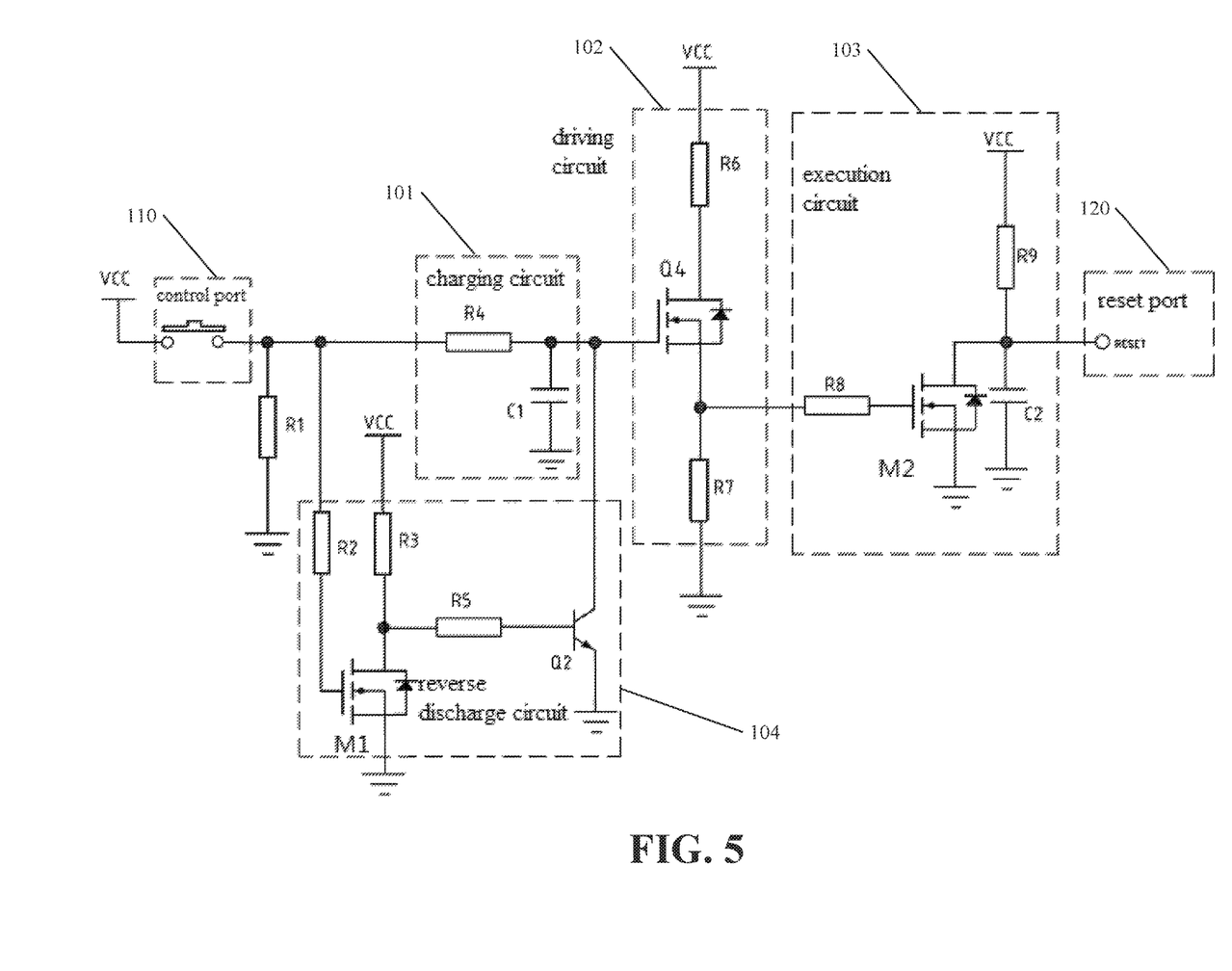
FIG. 5 is a schematic circuit principle diagram of another reset circuit of the third implementation of the present disclosure.

As an alternative implementation, as illustrated in FIG. 5, in the implementation of the present disclosure, the reset circuit can further includes a reverse discharge circuit 104; the reverse discharge circuit 104 has an input end connected with the control port 110, an output end connected with the output end of the charging circuit 101, and is configured to generate a fourth voltage signal after a third voltage signal provided by the control port 110 is received, so as to discharge the charging circuit, that is, discharge the capacitor C1.

Specifically, the reverse discharge circuit 104 includes a filed effect transistor M1, a transistor Q2, and a third power supply end; the field effect transistor M1 has a gate which is the input end of the reverse discharge circuit 104, the transistor Q2 has a collector which is the output end of the reverse discharge circuit 104; the gate of the field effect transistor M1 is connected with the control port 110, and the field effect transistor M1 has a drain which is connected with a base of the transistor Q2, and the field effect transistor M1 has a source grounded; the base of the transistor Q2 is connected with the drain of the field effect transistor M1, the transistor Q2 has a collector connected with the output end of the charging circuit 101 and the input end of the driving circuit 102, and the transistor Q2 has an emitter grounded; the third power supply end is connected with the drain of the field effect transistor M1.

Furthermore, the reverse discharge circuit 104 further includes a resistor R2, a resistor R3, and a resistor R5; the gate of the field effect transistor M1 is connected to the control port 110 via the resistor R2, the drain of the field effect transistor M1 is connected to the base of the transistor Q2 via the resistor R5; the third power supply end is connected to the drain of the field effect transistor M1 via the resistor R3.

That is to say, as illustrated in FIG. 5, the reverse discharge circuit includes the resistor R2, the resistor R3, the resistor R5, the MOS transistor M1, the transistor Q2, and the third power supply end; among them, the resistor R2 has one end connected with the control port; the gate of the MOS transistor M1 is connected with the other end of the resistor R2, and the source of the MOS transistor M1 is grounded; the resistor R5 has one end connected with the drain of the MOS transistor M1; the base of the transistor Q2 is connected with the other end of the resistor R5, the emitter of the transistor Q2 is grounded, and the collector of the transistor Q2 is connected with the output end of the charging circuit; the third power supply end is connected to the drain of the MOS transistor M1 via the resistor R3.

In this implementation, the third voltage signal is a low level signal; when the control port provides a high level signal, the field effect transistor M1 of the reverse discharge circuit is turned on while the transistor Q2 is turned off, at this point, the reverse discharge circuit has no effect on the charging circuit; however, the capacitor C1 stops charging when the control port provides a low level signal, at this point, the field effect transistor M1 is turned off and the transistor Q2 is turned on, and the reverse discharge circuit will generate a fourth voltage signal for the capacitor C1 and perform discharge operation on the capacitor C1; the value of the level signal of the capacitor C1 drops below a preset value rapidly, such that the MOS transistor Q4 and the field effect transistor M2 turn off rapidly, the capacitor C2 continues to be charged and returns to a high level gradually to end the reset state. By providing the reverse discharge circuit 104, the capacitor C1 can be discharged rapidly to end the reset state, when the reset operation is released, the microcontroller can enter a normal work state quickly and reset effects can be eliminated.

In the implementation of the present disclosure, as illustrated in FIG. 3 or FIG. 5, the first power supply end of the driving circuit, the second power supply end of the execution circuit, and the third power supply end of the reverse discharge circuit share a power supply VCC.

Figure 6:
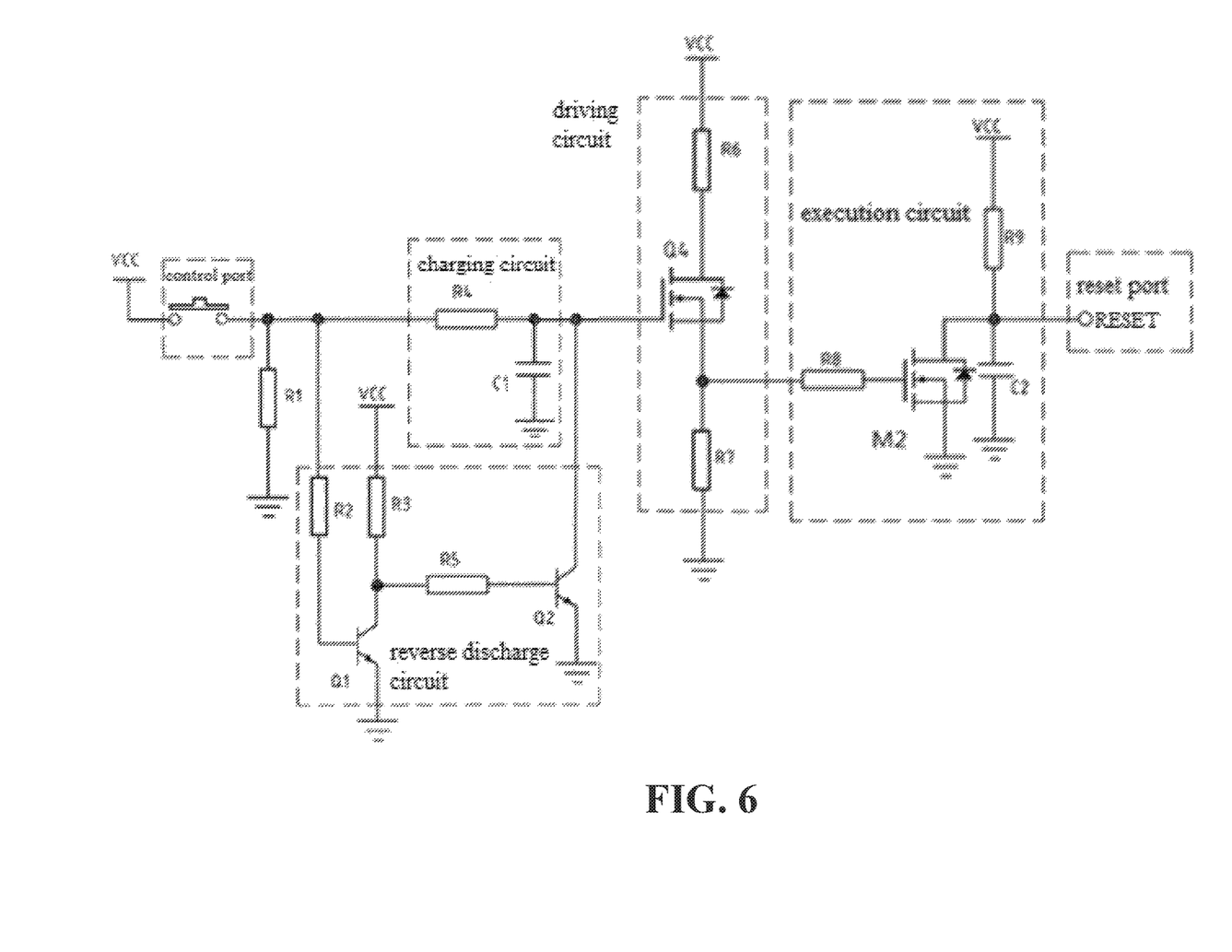
FIG. 6 is a schematic circuit principle diagram of a reset circuit of another implementation of the present disclosure.
Figure 7:
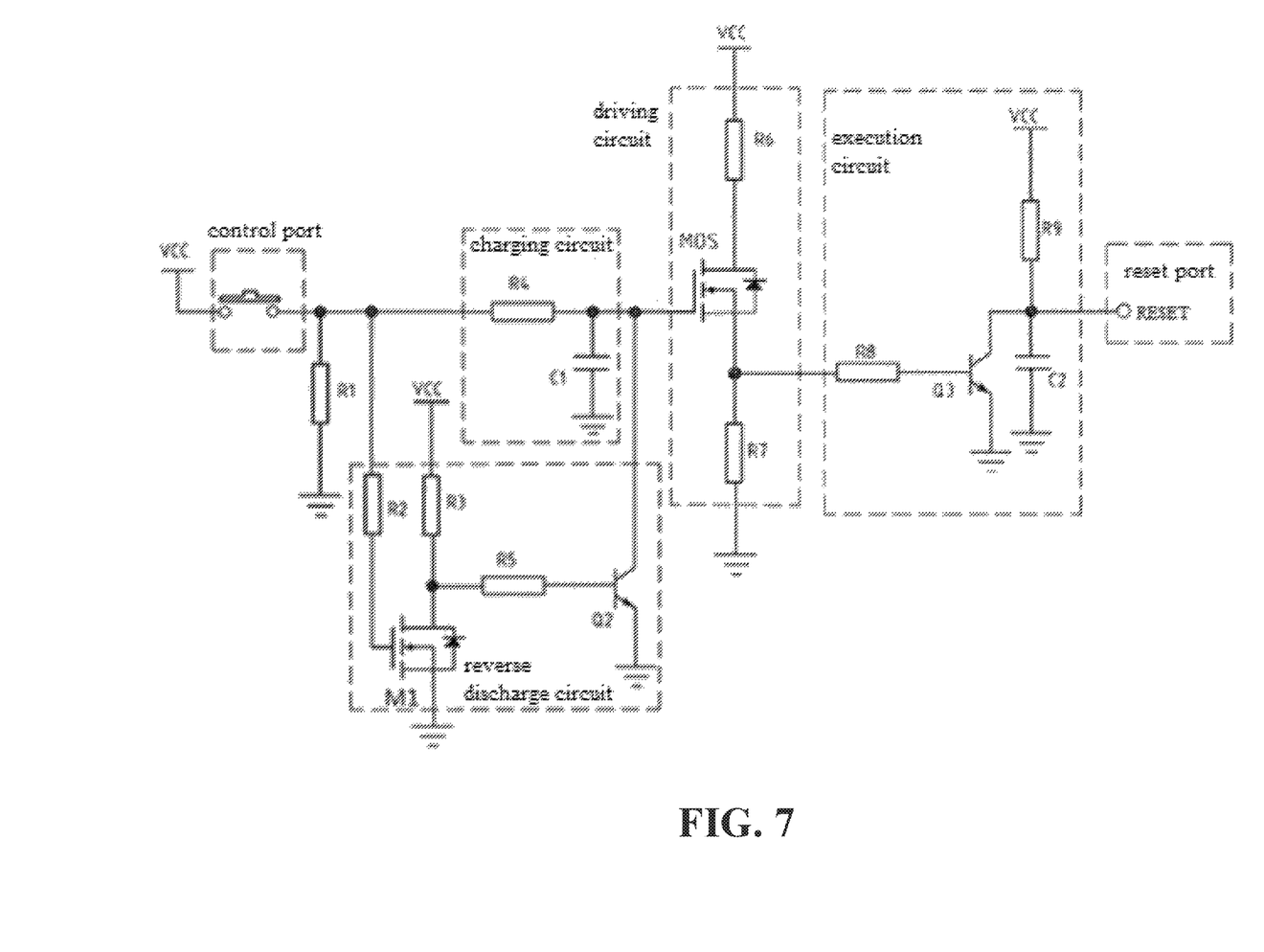
FIG. 7 is a schematic circuit principle diagram of a reset circuit of another implementation of the present disclosure.

The reset circuits described illustrated before are exemplary implementations and the present disclosure is not limited thereto. For example, the execution circuit illustrated in FIG. 2 or FIG. 3 can be exchanged with the one illustrated in FIG. 4 or FIG. 5, similarly, the reverse discharge circuit illustrated in FIG. 3 can be exchanged with the one illustrated in FIG. 5. Based on this, FIG. 6 and FIG. 7 illustrate another structure of the reset circuit of the present disclosure respectively and the details thereof will not be repeated here. As can be seen, the present disclosure has no restriction on the use of the MOS transistor and the transistor.

Electric Device

Figure 8:
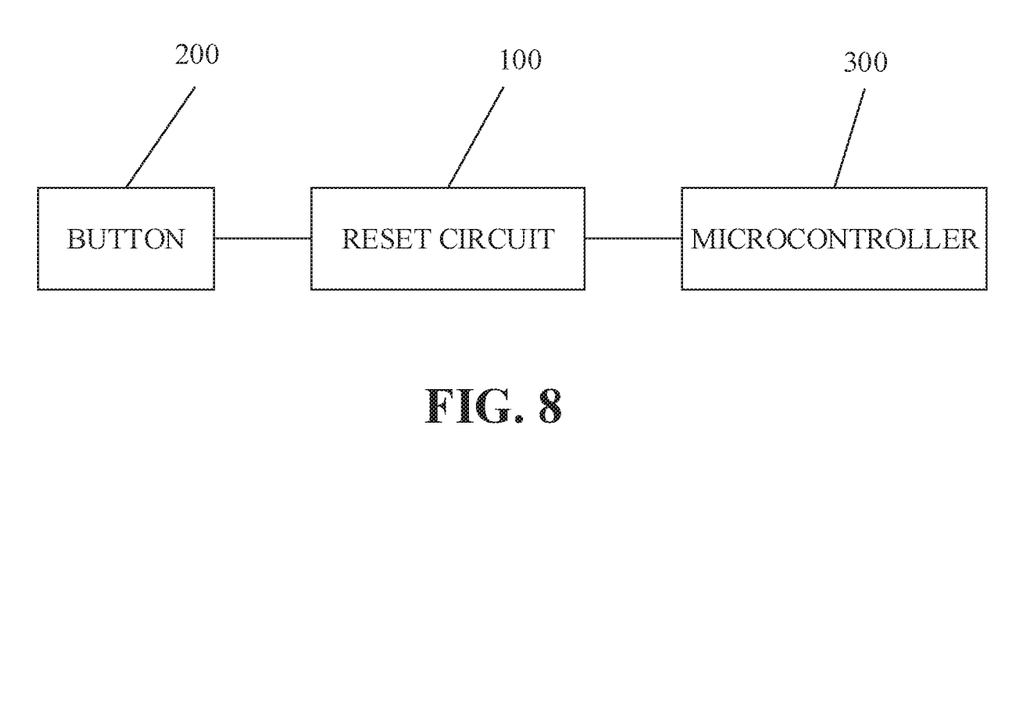
FIG. 8 is a schematic structure diagram of an electric device of an implementation of the present disclosure.

FIG. 8 is a schematic structure diagram of an electronic device according to an implementation of the present disclosure.

Refer to FIG. 8, the electric device provided in this implementation of the present disclosure includes the reset circuit 100 of the above-mentioned first implementation, the second implementation, or the third implementation as well as a button 200 and a microcontroller 300. The control port 110 is configured to provide the first voltage signal when the button 200 is pressed; the reset port 120 is configured to perform a reset operation on the microcontroller 300 when the reset port 120 receives the reset signal.

When the reset circuit 100 is applied to the electric device including the button 200 and the microcontroller 300, if the button 200 is being operated on, the control port 110 can be caused to provide the first voltage signal, and the charging circuit 101 can generate a second voltage signal after the first voltage signal is received; when the value of the second voltage signal reaches a preset value, the driving circuit 102 will amplify the second voltage signal and output the amplified second voltage signal to the execution circuit 103; after receiving the amplified second voltage signal, the execution circuit 103 can generate a rest signal and transfer the same to the reset port 120; the reset port 120 can be connected with an element to be reset on the electric device, and in this implementation, the element to be reset is a microcontroller. When the reset signal is received, the reset port 120 will perform a reset operation on the microcontroller. The button 200 can be a tact switch or a combination of several tact switches. The operation performed on the button 200 can be to press and hold a touch switch for a preset time, or press and hold a combination of several touch switches at the same time, at this point, the control port 110 provides the first voltage signal. Alternatively, the button operation can be replaced with a knob operation, and the present disclosure is not limited thereto.

It should be noted that, in the application scenario of the present implementation, a high level signal is generated when the button is pressed, and a low level signal is generated when the button is released. The reset circuit of the implementation of the present disclosure can be applied to different electronic devices, and in an implementation, the reset circuit is applied to a headphone power amplifier and is configured to perform reset operation on a microcontroller of the headphone power amplifier.

Implementations of the present disclosure have the following advantageous effects: the present disclosure designs a reset circuit; when the reset circuit is applied to an electric device including a button and a microcontroller, if the button is pressed to cause the control port to provide the first voltage signal, the charging circuit will generate the second voltage signal after the first voltage signal is received; if the driving circuit detects that the value of the second voltage signal reaches a preset value, the second voltage signal will be amplified and the amplified second voltage signal will be output to the execution circuit; the execution circuit generates a reset signal after the second voltage signal is received and transfer the reset signal to the reset port, and the reset port performs a reset operation on the microcontroller to achieve the reset function of the electric device. At the same time, the driving circuit 102 can amplify a level signal of the capacitor C1 which has reached a preset value, so as to avoid the case that it is unable to drive because of the large value of the resistor R1 and the weak drive capacity of the charging circuit 101. Furthermore, by providing the reverse discharge circuit 104, the capacitor C1 can be discharged rapidly so as to end the reset state, and the microcontroller can enter a normal work state after the reset operation is released, whereby reset effects can be eliminated. By means of the implementations of the present disclosure, when a reset operation is required, it is not necessary to make a large change in the structure and appearance of the electronic device and no dedicated button is needed to be separately occupied to perform the reset operation; a reset function can be achieved in a manner of pressing an existing button without the use of any external tool, thereby avoiding false triggering effectively.

It should be noted that, the implementation of the present disclosure is not susceptible to false trigger because the reset circuit of the implementation of the present disclosure needs to be delayed by charging the capacitor C1 to output the reset signal. That is to say, when the button is associated with the control port, the button can be touched or short pressed to achieve basic functions thereof, or can be long-pressed to trigger the reset function. For example, the button can be touched within 1 second to achieve a "show power request" function of an electronic device, or, the button can be short pressed for about 3 seconds to achieve a "switch the external power supply status" function of the electronic device, or, the button can be long-pressed for more than 15 seconds to achieve a "reset" function of the electric device, therefore, the reset function can be achieved without adding any button, at the same time, it is not susceptible to false trigger and is user-friendly.

While the present disclosure has been described in detail above with reference to the exemplary implementations, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A reset circuit, comprising:
   a control port;
   a reset port;
   a charging circuit comprising an input end connected with the control port, configured to generate a second voltage signal after a first voltage signal provided by the control port is received;
   a driving circuit comprising an input end connected with an output end of the charging circuit, wherein the driving circuit is configured to amplify the second voltage signal after it is detected that the second voltage signal reaches a preset value and output the second voltage signal amplified to the execution circuit; and
   an execution circuit comprising an input end connected with an output end of the driving circuit, and an output end connected with the reset port, wherein the execution circuit is configured to generate a reset signal after the second voltage signal amplified is received and transfer the reset signal to the reset port;
   wherein the driving circuit comprises a MOS transistor, a resistor R7, and a first power supply end,
   wherein the MOS transistor comprises a gate as the input end of the driving circuit, a source as the output end of the driving circuit and is grounded via the resistor R7, and a drain connected with the first power supply end.

2. The reset circuit of claim 1, wherein the driving circuit further comprises a resistor R6, and the resistor R6 is connected between the first power supply end and the drain of the MOS transistor.

3. The reset circuit of claim 1, wherein the execution circuit comprises a transistor Q3, a capacitor C2, and a second power supply end, wherein the transistor Q3 comprises a base as the input end of the driving circuit, a collector as an output end of the execution circuit, and an emitter grounded;
   the emitter of the transistor Q3 is grounded via the capacitor C2; and
   the second power supply end is grounded via the capacitor C2.

4. The reset circuit of claim 3, wherein the execution circuit further comprises a resistor R8 and a resistor R9, the base of the transistor Q3 is connected with the output end of the driving circuit via the resistor R8, the collector of the transistor Q3 is connected with the second power supply end via the resistor R9, and the second power supply end is grounded via the resistor R9 and the capacitor C2.

5. The reset circuit of claim 1, wherein the execution circuit comprises a resistor R8, a resistor R9, a MOS transistor M2, a capacitor C2, and a second power supply end, wherein
   the resistor R8 comprises one end connected with the output end of the driving circuit;
   the MOS transistor M2 comprises a gate connected with the other end of the resistor R8, the MOS transistor M2 comprises a source grounded, and the MOS transistor M2 comprises a drain connected with the reset port;
   the resistor R9 comprises one end connected with the drain of the MOS transistor M2, the resistor R9 comprises the other end connected with the second power supply end; and
   the capacitor C2 comprises one end connected with the drain of the MOS transistor, and the capacitor C2 comprises the other end grounded.

6. The reset circuit of claim 1, wherein the reset circuit further comprises a reverse discharge circuit, wherein the reverse discharge circuit comprises an input end connected with the control port, and output end connected with the output end of the charging circuit, the reverse discharge circuit configured to generate a fourth voltage signal after receiving a third voltage signal provided by the control port to discharge the charging circuit.

7. The reset circuit of claim 6, wherein the reverse discharge circuit comprises a transistor Q1, a transistor Q2, and a third power supply end;
   the transistor Q1 comprises a base as the input end of the reverse discharge circuit, and the transistor Q2 comprises a collector as the output end of the reverse discharge circuit;
   the transistor Q1 comprises a collector connected with a base of the transistor Q2, and the transistor Q1 comprises an emitter grounded;
   the collector of the transistor Q2 is connected with the input end of the driving circuit, and the transistor Q2 comprises an emitter grounded; and
   the third power supply end is connected with the collector of the transistor Q1.

8. The reset circuit of claim 7, wherein the reverse discharge circuit further comprises a resistor R2, a resistor R3, and a resistor R5;
   the base of the transistor Q1 is connected with the control port via the resistor R2, and the collector of the transistor Q1 is connected to the base of the transistor Q2 via the resistor R5; and the third power supply end is connected to the collector of the transistor Q1 via the resistor R3.

9. The reset circuit of claim 6, wherein the reverse discharge circuit comprises a resistor R2, a resistor R3, a resistor R5, a MOS transistor M1, a transistor Q2, and a third power supply end, wherein the resistor R2 comprises one end connected with the control port;

the MOS transistor M1 comprises a gate connected with the other end of the resistor R2, and the MOS transistor M1 comprises a source grounded;

the resistor R5 comprises one end connected with a drain of the MOS transistor M1;

the transistor Q2 comprises a base connected with the other end of the resistor R5, the transistor Q2 comprises an emitter grounded, and the transistor Q2 comprises a collector connected with the output end of the charging circuit; and the third power supply end is connected with the drain of the MOS transistor M1 via the resistor R3.

10. The reset circuit of claim 6, wherein a first power supply end of the driving circuit, a second power supply end of the execution circuit, and a third power supply end of the reverse discharge circuit share a power supply VCC.

11. The reset circuit of claim 6, wherein the first voltage signal is a high level signal and the third voltage signal is a low level signal.

12. The reset circuit of claim 1, wherein the charging circuit comprises a resistor R4 and a capacitor C1, the resistor R4 and the capacitor C1 are connected in series, the resistor R4 comprises one end as the input end of the charging circuit, the resistor R4 comprises the other end connected with one end of the capacitor C1, the capacitor C1 comprises the other end grounded, and a node between the other end of the resistor R4 and one end of the capacitor C1 acts as the output end of the charging circuit.

13. The reset circuit of claim 12, wherein the charging circuit further comprises a resistor R1 comprising one end connected with the one end of the resistor R4, and the other end grounded.

14. The reset circuit of claim 1, wherein the control port is set in associate with a button of an electric device.

15. The reset circuit of claim 14, wherein the control port is configured to provide the first voltage signal when the button is triggered.

16. The reset circuit of claim 1, wherein the control port is set in associate with a knob of an electric device.

17. The reset circuit of claim 16, wherein the control port is configured to provide the first voltage signal when the knob is rotated to a preset location.

18. An electric device, comprising a reset circuit, a button, and a microcontroller, the reset circuit comprising a charging circuit, a driving circuit, an execution circuit, a control port, and a reset port, wherein the charging circuit comprises an input end connected with the control port, and is configured to generate a second voltage signal after a first voltage signal provided by the control port is received;

the driving circuit comprises an input end connected with an output end of the charging circuit, and is configured to amplify the second voltage signal after it is detected that the value of the second voltage signal reaches a preset value and output the second voltage signal amplified to the execution circuit;

the execution circuit comprises an input end connected with an output end of the driving circuit, an output end connected with the reset port, and is configured to generate a reset signal after the second voltage signal amplified is received and transfer the reset signal to the reset port;

the control port is configured to provide the first voltage signal when the button is pressed; and the reset port is configured to perform a reset operation on the microcontroller upon receiving the reset signal, wherein the reset circuit further comprises a reverse discharge circuit, wherein the reverse discharge circuit comprises an input end connected to the control port, and output end connected with the output end of the charging circuit, and is configured to generate a fourth voltage signal after receiving a third voltage signal provided by the control port to discharge the charging circuit.

* * * * *